United States Patent [19]
Burck et al.

[11] Patent Number: 5,261,776
[45] Date of Patent: Nov. 16, 1993

[54] VACUUM OPERATED WAFER TRANSFER APPARATUS

[75] Inventors: Ross H. Burck; Ernest E. Marks; Scott E. Moore, all of Boise, Id.

[73] Assignee: Micron Technology, Inc., Boise, Id.

[21] Appl. No.: 343,678

[22] Filed: Apr. 27, 1989

[51] Int. Cl.⁵ ............................................. B65G 65/00
[52] U.S. Cl. .................................... 414/416; 414/417; 414/404; 414/217; 414/620; 414/222; 187/17; 118/719; 901/47
[58] Field of Search .............. 414/217, 416, 417, 222, 414/225, 226, 403, 404, 626; 118/50, 51, 728, 729, 500, 719; 901/47; 187/17, 95; 60/407, 411, 412

[56] References Cited

U.S. PATENT DOCUMENTS

| | | | |
|---|---|---|---|
| 2,927,661 | 3/1960 | Kristek et al. | 187/17 |
| 4,493,606 | 1/1985 | Foulke et al. | 414/416 X |
| 4,566,841 | 1/1986 | Ohmura | 414/417 |
| 4,568,234 | 2/1986 | Lee et al. | 414/417 X |
| 4,573,851 | 3/1986 | Butler | 414/404 |
| 4,616,683 | 10/1986 | Tullis et al. | 414/217 X |
| 4,695,217 | 9/1987 | Lau | 414/404 |
| 4,763,941 | 8/1988 | Sniderman | 414/627 X |
| 4,781,511 | 11/1988 | Harada et al. | 414/416 X |
| 4,840,530 | 6/1989 | Nguyen | 414/417 X |
| 4,856,957 | 8/1989 | Lau et al. | 414/417 X |

FOREIGN PATENT DOCUMENTS 803867 11/1958 United Kingdom ................. 187/17

*Primary Examiner*—Frank E. Werner
*Attorney, Agent, or Firm*—Stan Protigal; Angus C. Fox

[57] ABSTRACT

The apparatus transfers a quantity of wafers from a first wafer boat to a second wafer boat. A wafer platform positioned beneath a wafer boat rises and transports the wafers to a pair of wafer grips which hold the wafers until the wafer platform is lowered and a second wafer about is in position to receive the wafers. The wafer platform is actuated by the negative pressure applied to alternating sides of a stage which divides a sealed cabinet into two portions. A vacuum is applied to alternating sides of the stage, while ambient air is introduced into the other side, causing the stage to move in the direction of lower pressure. The platform is affixed to the stage on at least two points.

9 Claims, 3 Drawing Sheets

VACUUM OPERATED WAFER TRANSFER APPARATUS

BACKGROUND OF THE INVENTION

This invention relates to an apparatus for removing a quantity of semi-conductor wafers, glass photomask plates, or the like, from a first wafer boat and replacing them into a second wafer boat. The term "wafer" as used herein is to be considered synonymous with any thin, flat planar material requiring delicate handling in a clean environment.

In the manufacture of integrated circuits, semi-conductor wafers or substrates from which the chips are cut are processed through a large number of steps. The basic material for the substrate of the wafer may be silicon, glass or ceramic materials of various sorts. In a number of separate and distinct processing steps, this substrate, or wafer, is subjected to coating, etching, cleaning, and testing. Such steps are most advantageously carried out with multiple wafers, rather than processing individual wafers. Therefore, such wafers are typically processed in groups of about twenty-five, and are assembled in "boats". Such boats are the conventional means of transporting wafers, and for holding wafers during processing, and may be made of metal, plastic, teflon, etc. Frequently, successive steps in the processing require that the wafers be transferred to a different type of boat, as one boat may be sensitive to a particular processing step while another type is not.

Therefore, machines have been developed which will remove all of the wafers from a first boat and transfer them to a second boat. However, such machines heretofore have operated by activating various components in the machines with pressurized air or inert gas. The problem which arises with prior art machines is that, since moving parts are required, contamination from wear of such parts is always a possibility. Furthermore, if the seals between the pressurized components and the ambient room within which the wafers are being processed wears or fails, the pressurized gaseous medium can "blow-by" the damaged seal, further contaminating the wafers and the air of the clean room within which the process is proceeding.

The present invention provides an apparatus and method for transferring wafers without the possibility of blow-by contamination resulting from the use of pressurized air. The principal of the present invention is that negative pressure can cause movement of machine parts, just as pressurized air can. Therefore, by utilizing negative pressure induced by vacuum to move machine parts, lower pressures (and therefore less expensive equipment) are necessary, smoother part movement may be obtained, and even if wear is experienced, contamination of the wafers or clean room will not be experienced.

Therefore, it is an object of the present invention to provide an apparatus, and a method, utilizing negative pressures, to automatically remove a plurality of wafers from a first boat and transfer them to a second boat.

SUMMARY OF THE INVENTION

The apparatus of the present invention is adapted to transfer a quantity of wafers from a first wafer boat to a second wafer boat. A sealed, airtight cabinet is provided with a pair of vertically spaced apart air passageways, dividing the interior of the cabinet into an upper portion and a lower portion, each with an air passageway. A travelling stage is positioned between the air passageways and defines the upper and lower portions. The stage is in sealing engagement with the inner surface of the cabinet. At least one, and preferably two, pistons are affixed to the upper surface of the stage and extend through the top surface of the cabinet, in sealing engagement with the top furface. Exterior of and above the sealed portion of the cabinet is a wafer platform affixed to the pistons. The wafer platform is adapted to interfit with, and maintain proper spacing of, the plurality of wafers in the first wafer boat.

Each of the air passageways is interconnected to both vacuum means and ambient air, or other relief means. A valve is provided such that when one of the upper or lower portions is being evacuated by the vacuum means, the other is interconnected with relief means, so that the stage will travel in the direction of the evacuated portion in response to the pressure differential.

Three-way valves, controlled by solenoids, may be provided to maintain the upper and lower portions in proper relationship. It is to be understood that there is no pressurized air used in this apparatus—the cycle is from evacuation to ambient to evacuation.

Wafer grip means are provided so that when the wafers in the wafer platform reach the uppermost limit of travel, the grip means are activated to hold the wafers while the wafer platform is lowered and the first boat is replaced with a second boat. The wafer platform is thereafter raised to again interconnect with the wafers, and when the grip means are released, the wafers are lowered on the wafer platform into the second boat. A controller having input from, for example, optical sensing means, can determine the location of the wafers and what the appropriate machine response should be.

DETAILED DESCRIPTION OF THE INVENTION

Figure 1:
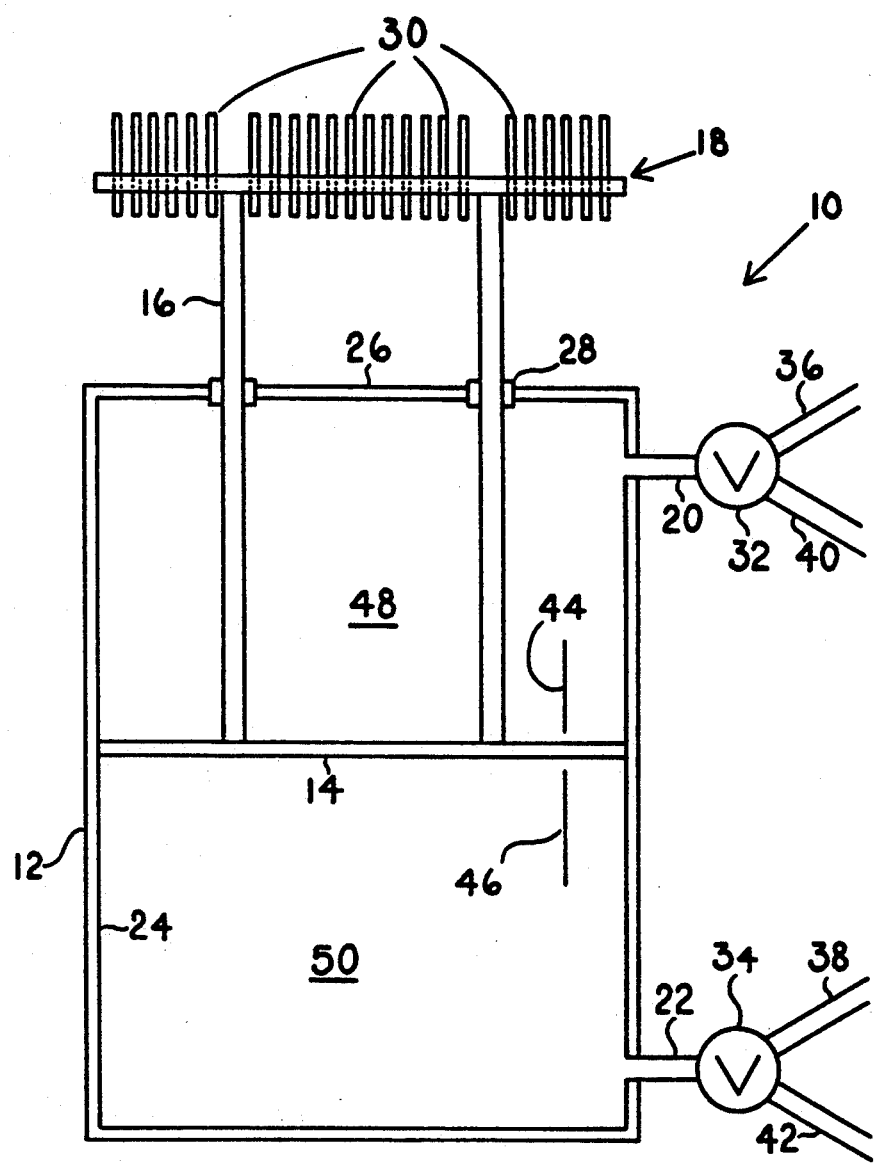
FIG. 1 is a schematic illustration of the wafer transfer apparatus of the present invention.

Referring now to the drawings, an apparatus 10 for transferring wafers is illustrated schematically in FIG. 1. Generally speaking, the device comprises a sealed, airtight cabinet 12, a travelling stage 14, at least one piston 16, a wafer platform 18 and a pair of air passageways 20, 22. The stage 14 is in sealing engagement with the interior surface 24 of the cabinet 12. Likewise, the pistons 16 are in sealing engagement with the top wall 26 of cabinet 12. Any conventional means may be utilized to seal these surfaces, such as gaskets 28 or typical silicon-type sealants. The wafer platform 18 is adapted to securely hold a plurality of wafers 30.

The air passageways 20, 22 are each provided a valve 32, 34 respectively. As illustrated in FIG. 1, the valves 32, 34 are three-way valves providing either a passageway 36, 38 to vacuum means, or a passageway 40, 42 to ambient air. As illustrated, when the passageway 20 is evacuating through conduit 36, the passageway 22 is open through conduit 42 to ambient air. Therefore, the stage 14 moves upwardly in the direction of arrow 44. When the passageway 22 is evacuating through conduit 38, the valve 32 opens conduit 40 providing ambient air, therefore the stage 14 moves downwardly in the direction of arrow 46. Generally speaking, the cabinet 12 may be considered divided into an upper portion 48 and a lower portion 50. The two portions are variable in that as the stage 14 moves upwardly or downwardly in response to the pressure differential, the volume of the portions changes.

Figure 2:
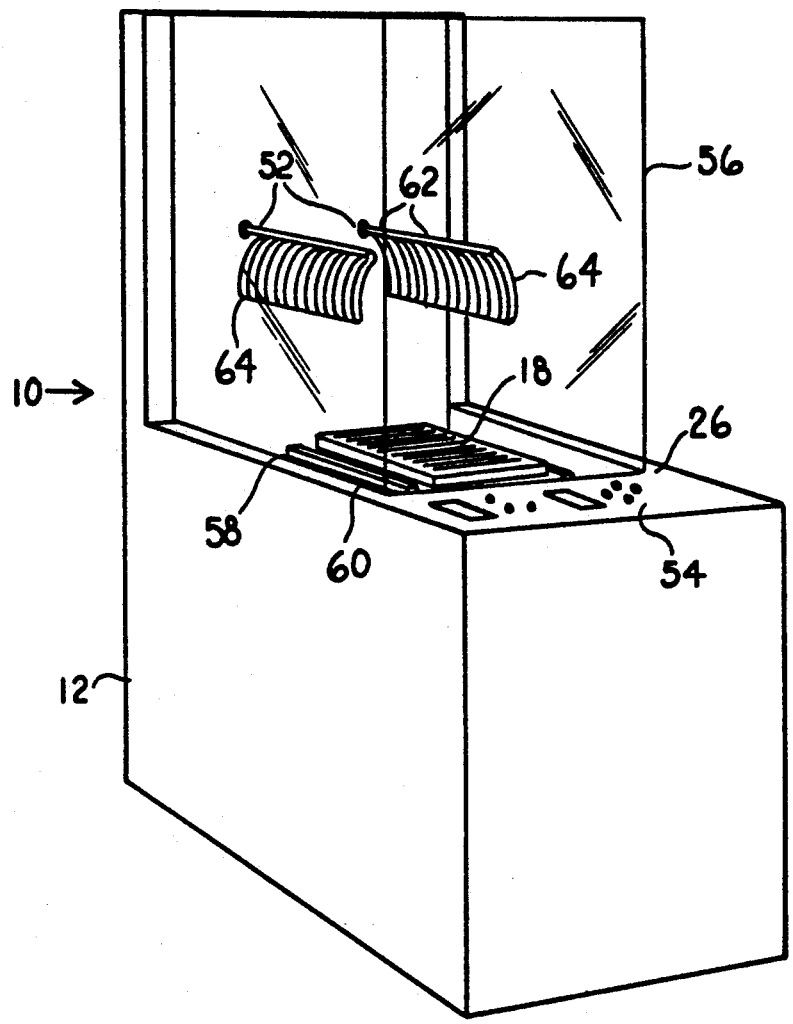
FIG. 2 is a perspective view of the apparatus of FIG. 1 with the wafers in a wafer boat.

More specifically, and with reference to FIG. 2, the device of the present invention further comprises a pair of wafer grip means 52 which are adapted to grip the wafers retained within the wafer platform 18. The cabinet is provided with a control panel 54 and a transparent hood 56. A base plate 58 is provided on the top 26 of cabinet 12. Grooves 60 are provided in the base plate in order to assure proper alignment of the wafer boat over the wafer platform 18. The grip means 52 consist of an elongate rod 62 and grooved flanges 64. The rods 62 rotate about their longitudinal axis in order to bring flanges 64 into engagement with the wafers held by wafer platform 18.

Applicant has found that it is preferable to mount the wafer platform 18 on two pistons 16 rather than one. Normal bending, warping and twisting of elongate metal rods such as would be used to make pistons 16 can result in a misalignment of the wafer platform with the wafers contained either in the wafer boat or held by grip means 52. Any such misalignment can result in damaged or ruined wafers. Therefore, with at least two pistons, misalignment problems are greatly reduced.

As illustrated, movement of the wafer platform 18 is effected by evacuation, rather than by positive pressurization. In the apparatus and process of this invention, the maximum pressurization is ambient pressure, or 14.7 psi. By providing one of the portions 48, 50 of the cabinet 12 with ambient pressure, the stage 14 will always move in the direction of the evacuated, or lower pressure, portion. Therefore, by alternating evacuation between one portion and the other, the stage can be made to move up and down. Because the device is never positively pressurized, even should the seals 28 fail, contaminated air will not be expelled adjacent the wafers or into the clean room.

While illustrated in FIG. 1 with a single valve and a single air passageway for each of the portions 48, 50, the device can be provided with a dual air passageway system having larger and smaller diameter passageways. Therefore, if greater air movement is desired in order to evacuate the cabinet more quickly, and thereby change boats more quickly, the larger diameter air passageway can be used. Otherwise, a smaller diameter passageway would suffice.

Figure 3:
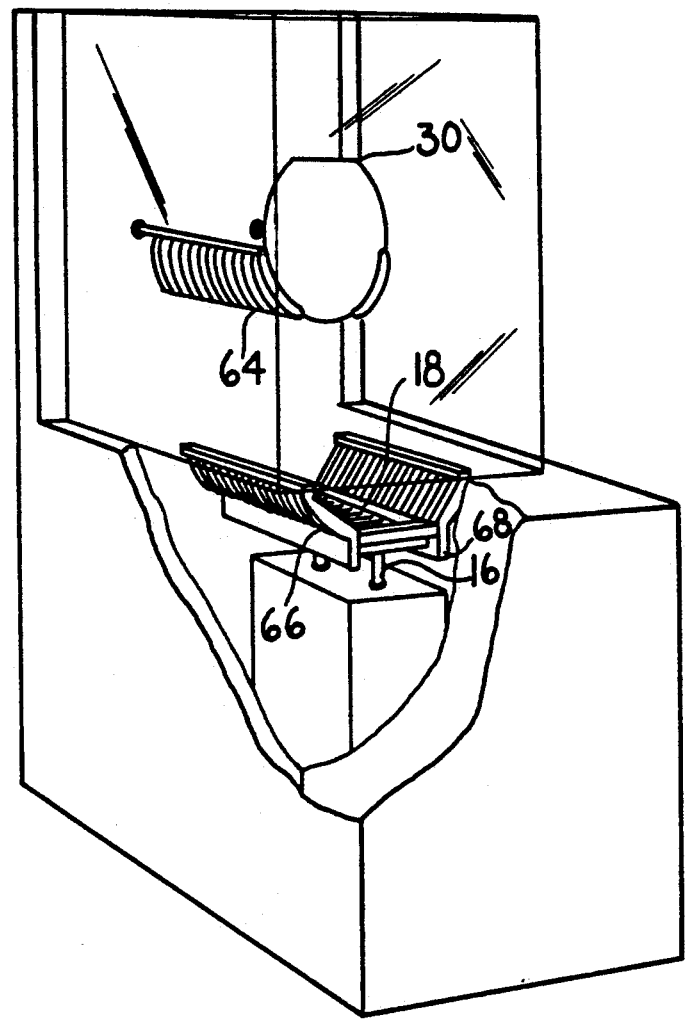
FIG. 3 is a perspective view of the apparatus of FIG. 2 with the wafers removed from the wafer boat.

As illustrated in FIG. 3, the pistons 16 have been extended with the wafer platform 18 empty beneath the wafers 30. The wafers are being securely held by the flanges 64 of grip means 52. As illustrated in FIG. 3, the wafer platform may be ascending as the upper portion 48 of the cabinet is being evacuated in order to pick up the wafers and drop them in a new wafer boat 66. Alternatively, the wafer platform may be descending as the lower portion of cabinet 12 is being evacuated; when the platform 18 is fully retracted, the wafer boat 16 will be removed and a new wafer boat inserted prior to repeating the process.

The wafer platform 18 and flanges 64 are provided with slots matching the legs 68 of the wafer boats 66, in order to ensure accurate registration of the wafers.

In a preferred embodiment, the apparatus of the present invention may be automated such that once the "start" command is given, the device will automatically proceed through the process without need of human intervention. For instance, sensors may be provided to automatically close the grip means when the wafer platform reaches its maximum extension, and on the next cycle, automatically opens the grip means when the wafer platform is appropriately positioned beneath the wafers to return the wafers to a new wafer boat. A controller may be programmed with all possible combinations of wafer platform and wafer grip means positions so that based upon the position of the wafers, the apparatus responds appropriately. For example, optical sensors may be used to locate the wafers.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. Apparatus to move at least one wafer, comprising:
   a. a sealed, airtight cabinet having a pair of vertically spaced apart upper and lower air passageways therethrough;
   b. a travelling stage between the air passageways dividing the cabinet into upper and lower airtight portions, each with an air passageway therethrough;
   c. at least one piston affixed to the stage and extending through the top surface of the cabinet in sealing engagement therewith;
   d. a wafer platform affixed to said at least one piston at a location external to the cabinet; and
   e. each of said air passageways interconnected to vacuum means which, when activated, cause the stage to move vertically in response to the pressure differential created by the vacuum means;
   whereby the wafer platform, and any wafer supported thereby, is moved up by the vacuum means reducing pressure in the upper airtight portion via said upper air passageway, and blow-by is eliminated because of pressure in the upper airtight portion being less than pressure external to the cabinet, and whereby the wafer platform, and any wafer supported thereby, is moved down by the vacuum means reducing pressure in the lower airtight portion via said lower air passageway, and blow-by is eliminated because of pressure in the upper airtight portion being less than or equal to pressure external to the cabinet.

2. The apparatus of claim 1, wherein said at least one piston comprises a pair of pistons affixed to an upper surface of the travelling stage.

3. The apparatus of claim 1, wherein each of said passageways is provided with a three-way valve interconnected either to the vacuum means or to ambient air.

4. The apparatus of claim 3, wherein in a first position the valve is connected to the vacuum means and in a second position the valve is connected to ambient air.

5. The apparatus of claim 4, wherein the valve of the upper air passageway is in the first position, the travelling stage rises, and when the valve of the lower air passageway is in the first position, the travelling stage descends.

6. The apparatus of claim 1, further comprising means so that when the wafer platform is extended to a predetermined position, wafer grip means may be actuated to grip at least one of any wafers supported by the wafer platform.

7. The apparatus of claim 6, further comprising means so that when the wafer platform is extended to said predetermined position, said wafer grip means may be actuated to release at least one of any wafer gripped thereby.

8. The apparatus of claim 7, wherein the wafer platform is configured to be able to pass vertically through a wafer boat, so that a wafer boat may be placed over the wafer platform when the wafer platform is withdrawn, and any wafer contained in a wafer boat so placed will be moved up and be gripped by said wafer grip means as the wafer platform extends, and so that any wafer gripped by said wafer grip means may be released to the wafer platform when extended and lowered into a boat so placed as the wafer platform withdraws, while a boat so placed may remain stationary or be replaced by another wafer boat, making possible wafer transfer from wafer boat to wafer boat.

9. Apparatus to move a workpiece, comprising:
  a. a sealed, gastight cabinet having spaced apart first and second gas passageways therethrough;
  b. a travelling stage between the gas passageways dividing the cabinet into first and second gastight portions, each with one of said gas passageways therethrough;
  c. at least one piston affixed to the stage and extending through a surface of the cabinet in sealing engagement therewith;
  d. a workpiece holder affixed to said at least one piston at a location external to the cabinet; and
  e. each of said gas passageways interconnected to negative pressure means which, when activated, cause the stage to move in a direction parallel to said at least one piston in response to the pressure differential created by the negative pressure means;
whereby the workpiece holder, and any workpiece supported thereby, is moved in a first direction by the negative pressure means reducing pressure in the first gastight portion via said first gas passageway, and blow-by is eliminated because of pressure in the first gastight portion being less than pressure external to the cabinet, and whereby the workpiece holder, and any workpiece supported thereby, is moved in a second direction by the negative pressure means reducing pressure in the second gastight portion via said second gas passageway, and blow-by is eliminated because of pressure in the second gastight portion being less than or equal to pressure external to the cabinet.

* * * * *